(12) United States Patent
Murakami

(10) Patent No.: US 6,307,793 B1
(45) Date of Patent: Oct. 23, 2001

(54) MEMORY DEVICE, COUPLING NOISE ELIMINATOR, AND COUPLING NOISE ELIMINATION METHOD

(75) Inventor: Hiroaki Murakami, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/604,910

(22) Filed: Jun. 28, 2000

(30) Foreign Application Priority Data

Jun. 29, 1999 (JP) .................................................. 11-184260

(51) Int. Cl.[7] ...................................................... G11C 7/00
(52) U.S. Cl. ................ 365/189.11; 365/154; 365/230.05
(58) Field of Search ............................. 365/189.11, 154, 365/230.05, 129, 189.01, 230.01

(56) References Cited

U.S. PATENT DOCUMENTS

| 5,590,087 | * | 12/1996 | Chung et al. | 365/230.05 |
| 5,790,461 | * | 8/1998 | Holst | 365/189.04 |
| 6,097,664 | * | 8/2000 | Nguyen et al. | 365/230.05 |

FOREIGN PATENT DOCUMENTS

| 58-019794 | 2/1983 | (JP) . |
| 10-269779 | 10/1998 | (JP) . |

* cited by examiner

*Primary Examiner*—Hoai V. Ho
(74) *Attorney, Agent, or Firm*—Oblon, Spivak, McClelland, Maier & Neustadt, P.C.

(57) ABSTRACT

In a memory device having a plurality of memory cells arranged in matrix as a memory cell array, pull down transistors (21, 22) are formed on a write word line wrword0 where the write word line wrword0 is adjacent in configuration to a read word line rdword0. When the read word line rdword0 is a H level during data read from the memory cells, both the pull down transistors (21, 22) enter ON and the write word line wrword0 is set to a L level. Thereby, only a coupling noise voltage of a small magnitude is generated on the write word line wrword0 even if the read word line rdword0 adjacent to the write word line wrword0 is the H level. Because the coupling noise voltage generated is smaller than a threshold voltage Vth of a transfer gate (1) for data write of the memory cell, the transfer gate (1) cannot enter ON and no write error occurs.

8 Claims, 13 Drawing Sheets

MEMORY DEVICE, COUPLING NOISE ELIMINATOR, AND COUPLING NOISE ELIMINATION METHOD

BACKGROUND OF THE INVENTION

1. Field of the Invention

The present invention relates to a memory device including a plurality of memory cells arranged in matrix form as a memory cell array in which a read word line and a write word line are adjacent in configuration to each other, and, relates to a coupling noise elimination method and a coupling noise eliminator for eliminating coupling noise generated between the adjacent read word line and write word line.

2. Description of the Related Art

There have been multi-port memories such as a register file, as the memory device according to the present invention, in which a write port is separated in configuration from a read port.

FIG. 1 is a circuit diagram showing a configuration of a memory cell array in a conventional memory device of 3 read/2 write in which a write port is separated in configuration from a read port. In FIG. 1. a memory cell comprises transfer gates 1 and 2 for inputting write-in data and a memory element 3 including inverters 31 and 32, and NMOS transistors 4 to 9 through which data stored in the memory element 3 are read out.

FIG. 2 is a block diagram showing a configuration of a register file including a plurality of the memory cells shown in FIG. 1. As shown in FIG. 2, the register file has the configuration of 32 entries/32 bits, and which comprises a memory cell array 100, an address decoder 12 for generating addresses to be transferred to the memory cell array 100, a readout data storing circuit 13 for storing data red from the memory cell array 100, and a write-in data storing circuit 14 for storing write-in data to be transferred to and written into the target memory cell in the memory cell array 100.

Next, a description will be given of the operation of the conventional memory device, namely, the register file shown in FIG. 2 with reference to a timing chart shown in FIG. 3.

The circuit elements such as the address decoder 12, the readout data storing circuit 13, the write-in data storing circuit 14 shown in FIG. 2 operate based on the clock supplied from outside.

In writing operation, the level of the write word line wrword0 designated by a write address wr0<4:0> shown in FIG. 2 becomes a High level (H level) when the clock is a Low level (L level). Thereby, the transfer gate 1 enters ON and the data (1 or 0) designated by the write bit line wrdata0 is transferred from the write-in data storing circuit 14 to the memory element 13 through the transfer gate 1.

In reading operation, the level of the read word line rdword0 designated by the read address rd0<4:0> shown in FIG. 2 becomes the H level when the clock CLK is the H level. Thereby, the NMOS transistor 4 enters ON and the data (1 or 0) stored in the memory element 3 is read and then transferred to the readout data storing circuit 12 through the NMOS transistor 5 and the read bit line rdword0.

In the configuration of the memory cell shown in FIG. 1, both the read word line rdword0 and the write word line wrword0 are adjacent to each other. FIG. 4 shows the detailed configuration of a word (each word has 32 memory cells) in the memory cell array of 32 words×32 bits in which the read word line rdword0 and the write word line wrword0 which are adjacent to each other. In this configuration, when the level of the write word line rdword0 is switched to the H level, the level of the read word line rdword0 is slightly raised in voltage level associated with the coupling capacitance Cc between the read word line rdword0 and the write word line wrword0 as shown at the timing T11 in FIG. 5. Because the change of the write word line wrword0 is a static process, the level of the write word line wrword0 is then shifted and fixed to, as the time proceeds, the L level as shown at the timing T12 in FIG. 5.

Recent advances in the state of the semiconductor fabrication art, namely, advanced semiconductor technologies in high speed and low voltage decrease a threshold voltage Vth in MOS transistors forming memory devices. In addition, the distance between adjacent signal lines in the semiconductor memory devices becomes narrow according to the progress of the miniaturization of LSI devices.

Accordingly, when the voltage which is temporarily generated in the write word line wrword0 is over the threshold voltage of the NMOS transistor as the transfer gate 1 for write-in data, the data "0" on the wrire word line wrword0 is written into the memory element 3 in the memory cell array 100, as shown by the reference character "(A)" in FIG. 5. This causes writing error.

A description will be given of the mechanism of writing error based on equations.

The kinds of capacitances generated on the writ word line wrword0 are as follows:

(1) A coupling capacitance Cc1 between the read word line rdword0 and the write word line wrword0;

(2) A coupling capacitance Cc2 between the write word lines wrword1 and wrword0;

(3) A capacitance Cs between the write word line wrword0 and a substrate; and (4) A gate capacitance Cg of a NOS transistor connected to the write word line wrword0.

In the following calculation, the capacitance Cg indicated by the case (4) can be neglected for simple calculation.

Recent miniaturization of LSI devices causes that the coupling capacitance Cc becomes equal to the capacitance Cs of the substrate. In general, the coupling capacitance Cc1 becomes equal to the coupling capacitance Cc2 because the wiring distance in the word lines has the minimum value.

When Cc=Cs and Cc1=Cc2, the coupling noise voltage by which the write word line wrword0 is raised is as follows:

$$\text{Coupling noise voltage} = (Cc/(Cc+Cs)) \cdot Vdd = Vdd/2.$$

For example, the coupling noise voltage becomes 1.0V when Vdd=2.0V.

When the wiring resistance of the word line is R[Ohm], the voltage level of the write word line wrword0 is raised to the coupling noise voltage of 1.0V during the rising time period $(2Cc+Cs) \cdot R$ of the read word line rdword0.

After this, because the voltage level of the write word line wrword0 is fallen to the L level during the time interval $(2Cc+Cs) \cdot a R$, the waveform of the voltage level of the write word line wrword0 can be shown by FIG. 6.

When the threshold voltage of the NMOS transistor as the transfer gate for write-in data is 0.4V, the following equation can be satisfied:

Coupling noise voltage=1.0V>Threshold voltage Vth (=0.4V) of the NMOS transistor as the transfer gate. Accordingly, the writing error happens because the NMOS transistor as the transfer gate 1 enters ON.

This kind of the coupling capacitance is also generated in the following case. As shown in FIG. 7, a coupling capacitance is generated in the read word line reword0 when the voltage level of the write word line wrword0 is changed to the H level at the timing T13. Thereby, the NMOS transistor 4 enters ON in spite of the data reading and a data item is then read from the memory element 3. This is the reading error.

SUMMARY OF THE INVENTION

Accordingly, an object of the present invention is, with due consideration to the drawbacks of the conventional technique, to provide a memory device having high reliability capable of eliminating any writing error and reading error caused by coupling noises, and to provide a coupling noise elimination method and a coupling noise eliminator capable of eliminating the generation of a coupling noise voltage between adjacent word lines in order to avoid the writing error and reading error.

In accordance with a preferred embodiment of the present invention, a memory device comprises a memory cell array made up of a plurality of memory cells arranged in matrix, a first signal line for transferring a first control signal to select the memory cell in the memory cell array, a second signal line adjacent in configuration to the first signal line, for transferring a second control signal to select the memory cell in the memory cell array, the first control signal and the second control signal being not generated simultaneously, and a first switching element of not less than one which enters ON/OFF state according to a level of the first control signal and for supplying a desired voltage to the second signal line when the first switching element enters ON.

In the memory device described above as another preferred embodiment, the first switching element is formed on the first signal line every desired number-th bit in the memory cells forming the memory cell array.

In the memory device described above as another preferred embodiment, the first switching element is formed on the first signal line every 16-th bit in the memory cells forming the memory cell array.

In the memory device described above as another preferred embodiment, the first switching element is formed on the first signal line every 32-th bit in the memory cells forming the memory cell array.

In the memory device described above as another preferred embodiment, the first switching element is a NMOS FET as a pull down transistor that is capable of setting the level of the second signal line to a desired level.

In accordance with another preferred embodiment of the present invention, the memory device further comprises a second switching element of not less than one which enters ON/OFF state according to a level of the second control signal and for supplying a desired voltage to the first signal line.

In the memory device described above as another preferred embodiment, the second switching element is formed on the second signal line every desired number-th bit in the memory cells forming the memory cell array.

In the memory device described above as another preferred embodiment, the second switching element is formed on the second signal line every 16-th bit in the memory cells forming the memory cell array.

In the memory device described above as another preferred embodiment, the second switching element is formed on the second signal line every 32-th bit in the memory cells forming the memory cell array.

In the memory device described above as another preferred embodiment, the second switching element is a NMOS FET as a pull down transistor that is capable of setting the level of the first signal line to a desired level.

In the memory device described above as another preferred embodiment, the first control signal is a read control signal to be used for reading data from the memory cell in the memory cell array and the second control signal is a write control signal to be used for writing data from the memory cell in the memory cell array.

In accordance with a preferred embodiment of the present invention, a coupling noise elimination method has the step of providing a desired voltage level to a second signal line, through which a second control signal being transferred, by a switching element that enters ON/OFF states according to a voltage level of a first control signal transferred through a first signal line adjacent in configuration to the second signal line, and the first control signal and the second control signal being not provided simultaneously.

In accordance with a preferred embodiment of the present invention, a coupling noise eliminator has a switch element that enters ON/OFF states according to a level of a first control signal transferred through a first signal line, and the switch element provides a desired voltage level to a second signal line adjacent in configuration to the first signal line, and a second control signal being transferred through the second signal line, and the first control signal and the second control signal being not generated simultaneously.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 1:
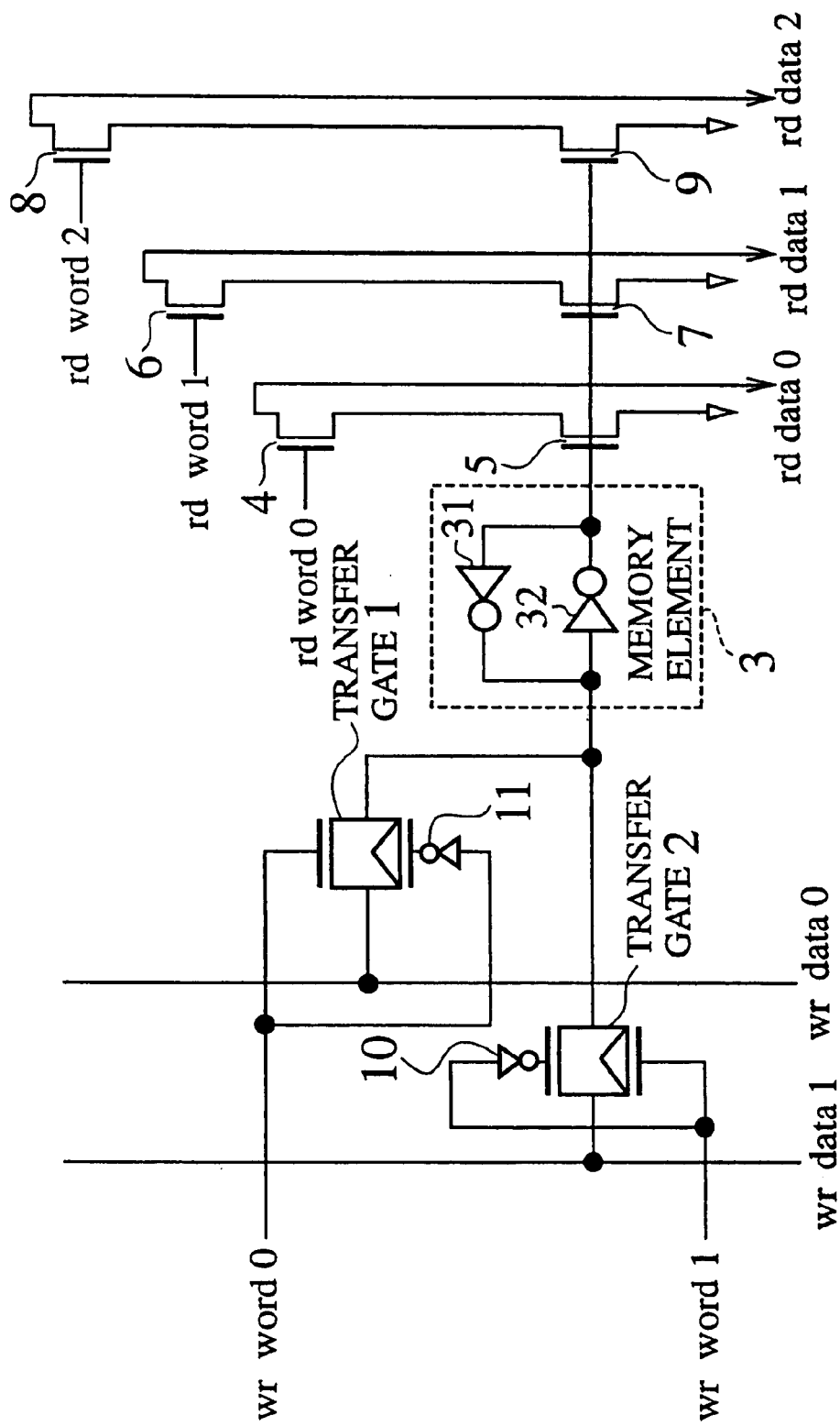
FIG. 1 is circuit diagram showing the configuration of a memory cell in a conventional memory device.
Figure 2:
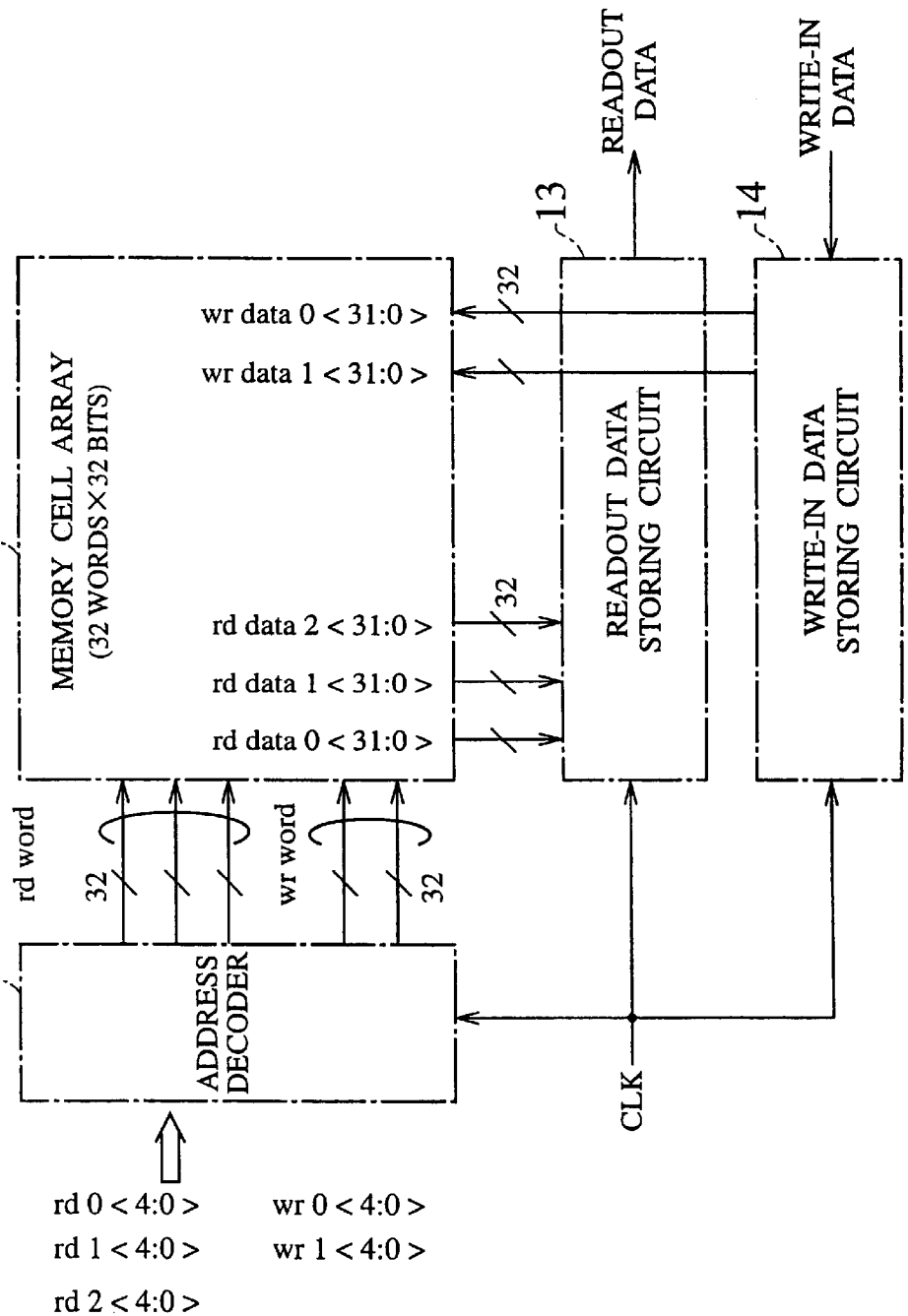
FIG. 2 is a block diagram of a register file including memory cell array the conventional memory device shown in FIG. 1.
Figure 3:
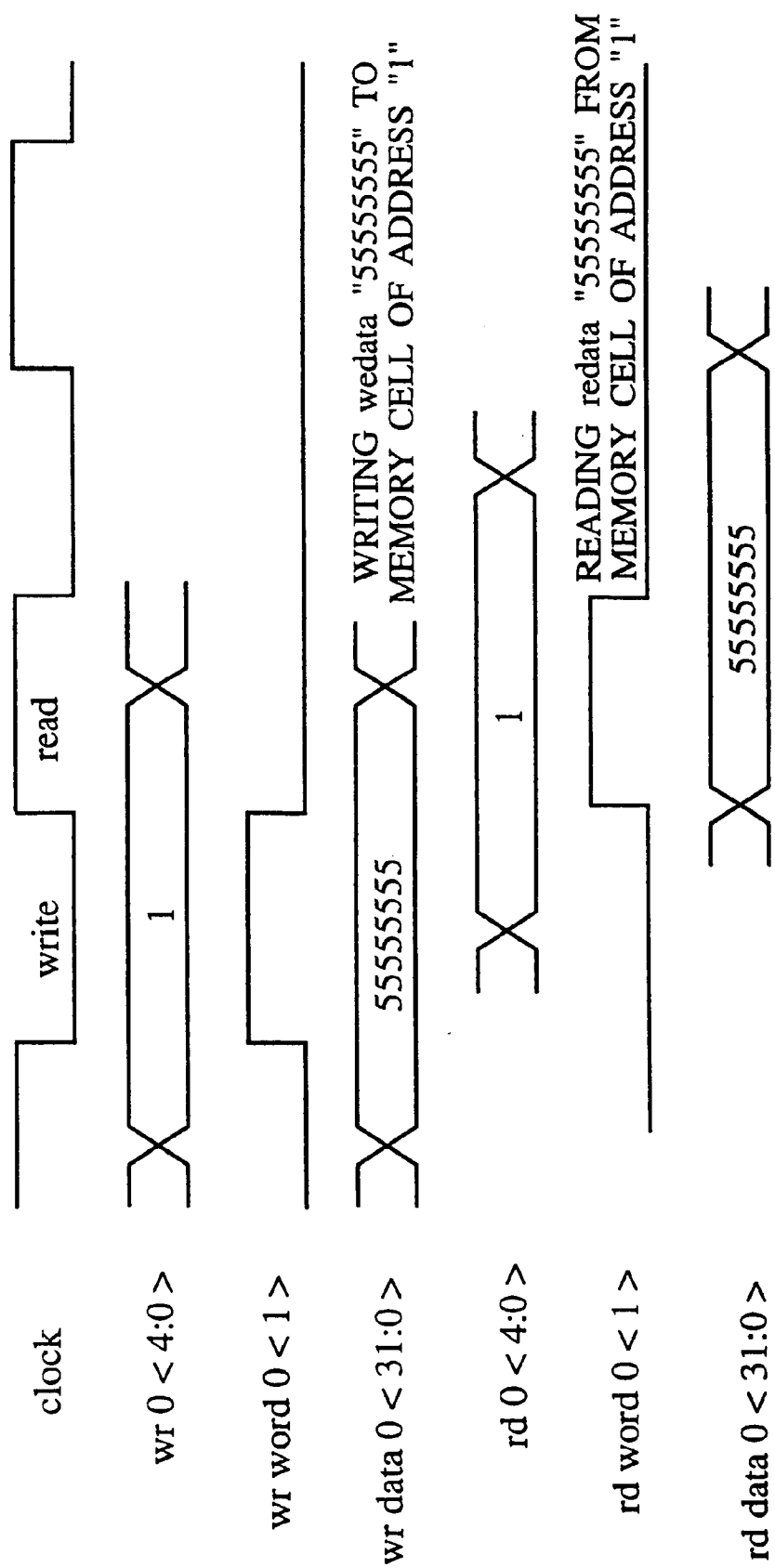
FIG. 3 is a timing chart showing the operation of the conventional register file.
Figure 4:
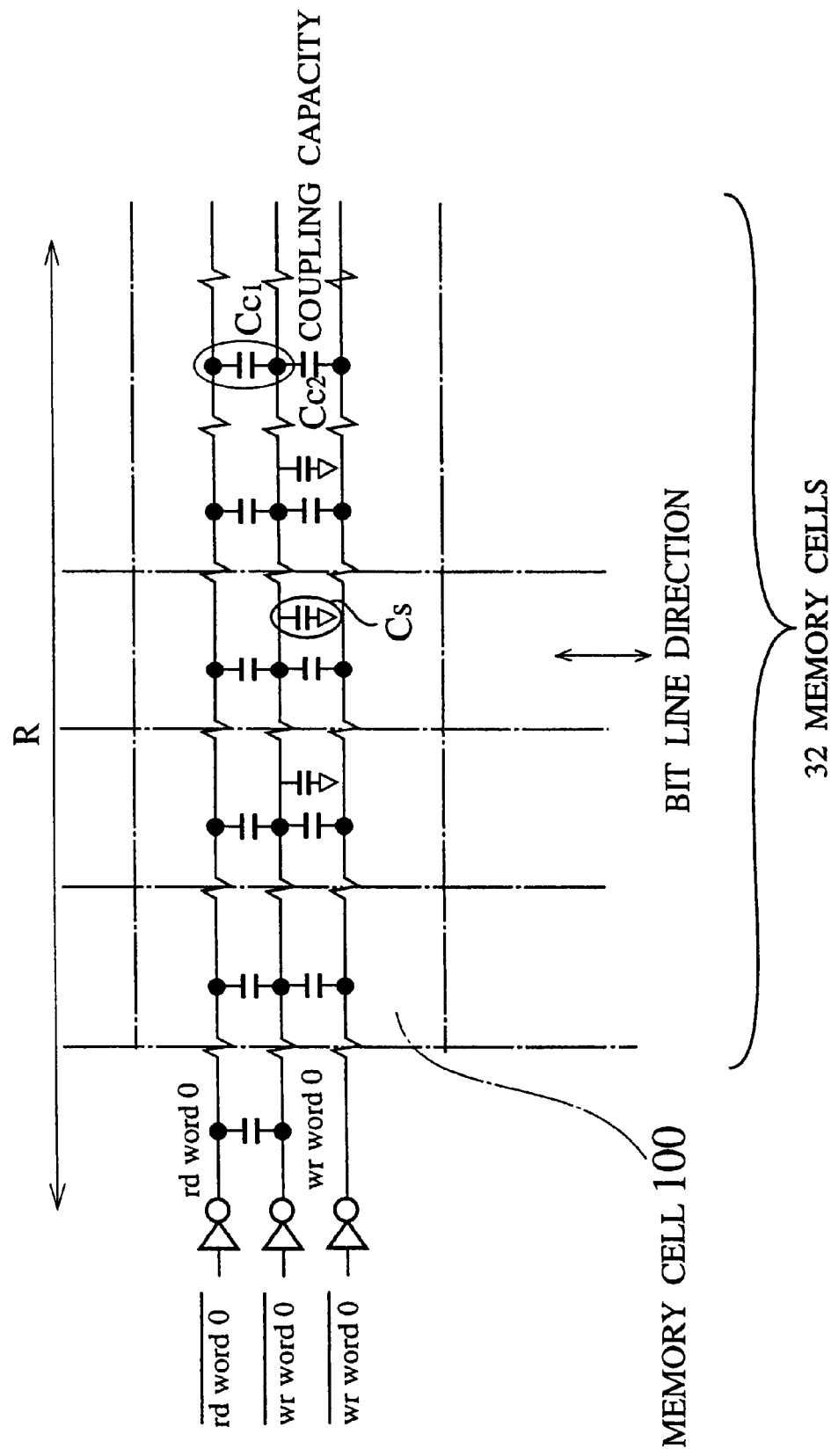
FIG. 4 is a schematic diagram of memory cells per word forming a memory cell array in the conventional memory device.
Figure 5:
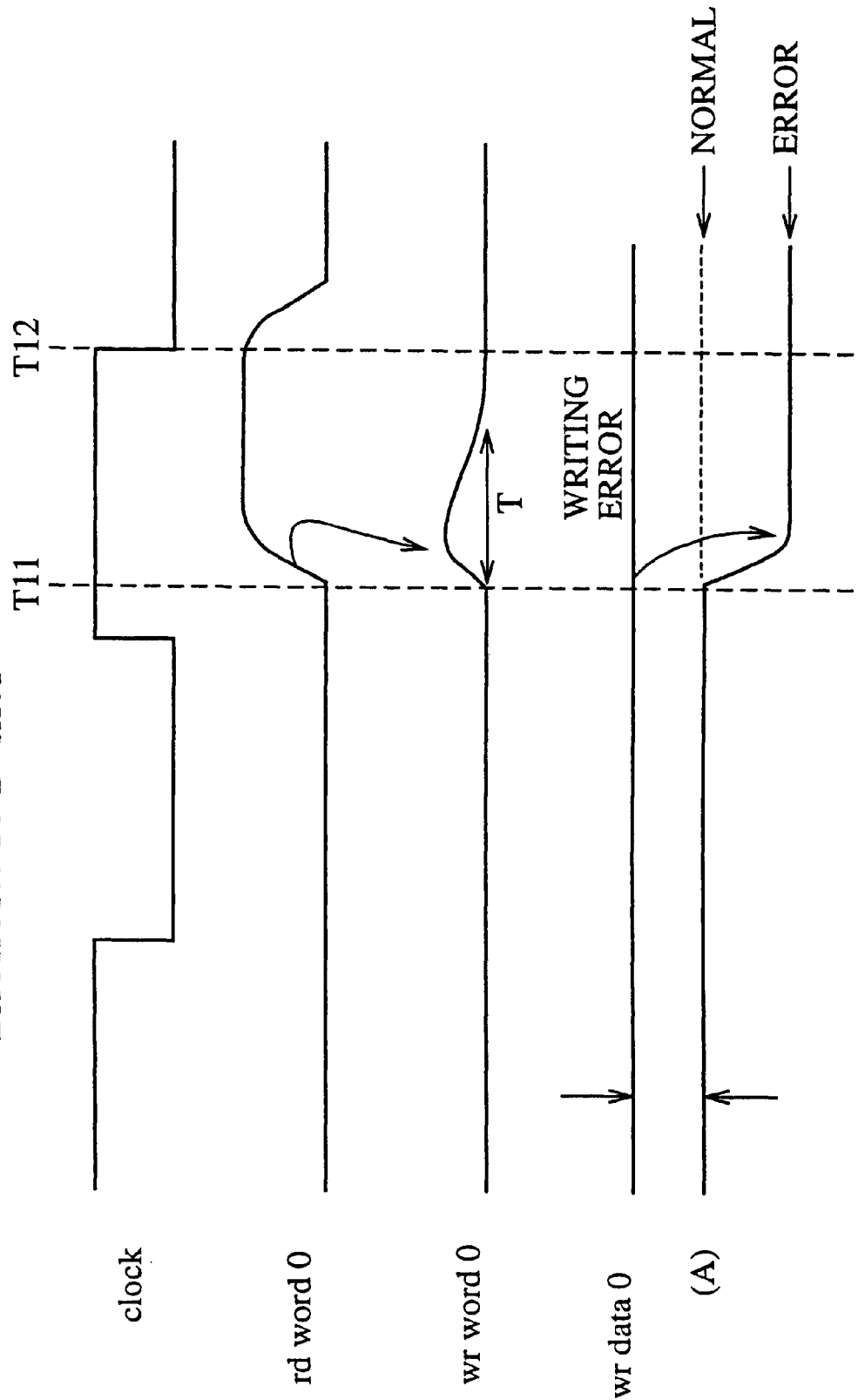
FIG. 5 is a diagram showing the waveform of writing error caused by a coupling noise voltage generated between a read word line and a write word line shown in FIG. 4.
Figure 6:
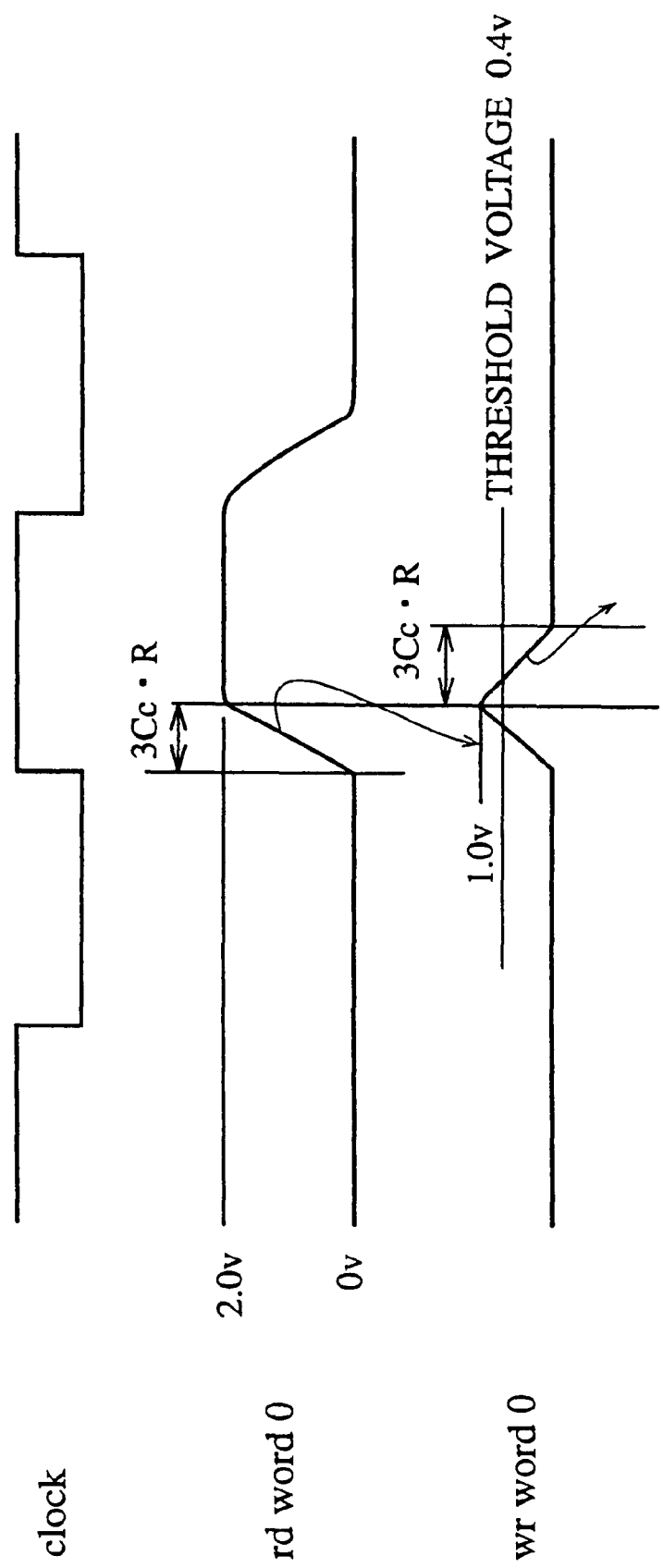
FIG. 6 is s diagram showing the waveform of a coupling noise voltage generated on the write word line in the conventional memory device.
Figure 7:
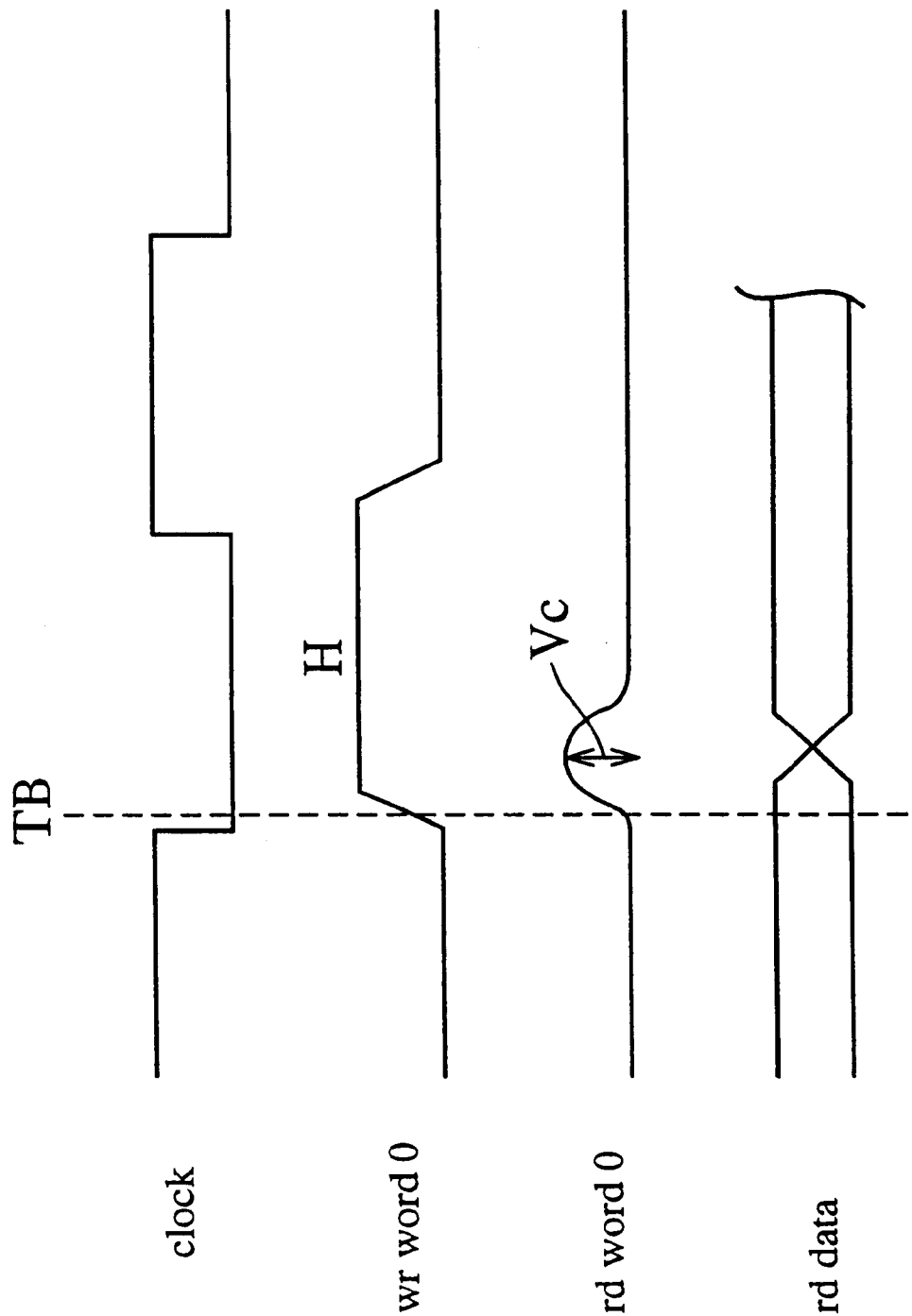
FIG. 7 is a diagram showing reading error in the conventional memory device during data writing.
Figure 8:
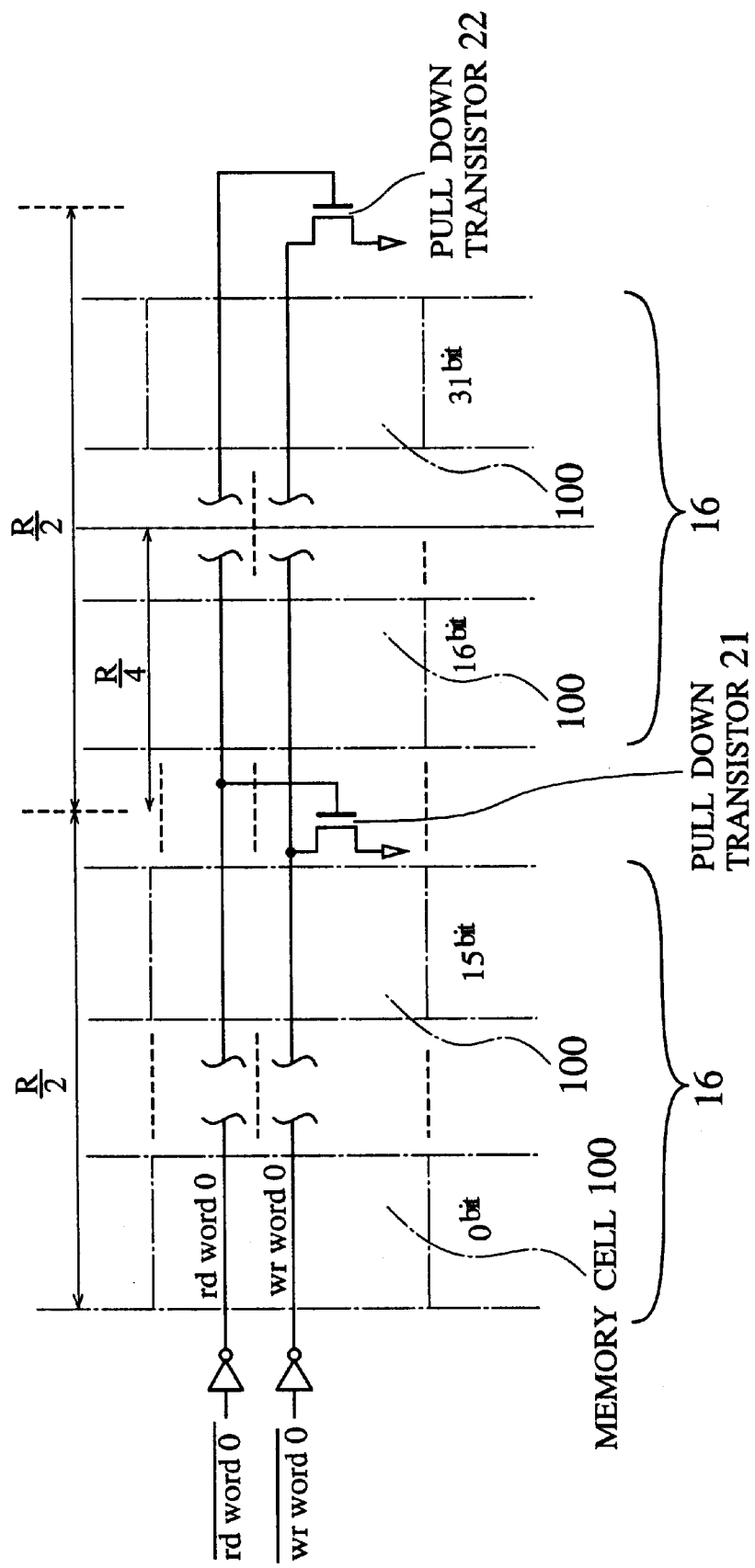
FIG. 8 is a schematic diagram showing a configuration of a memory device, including a coupling noise eliminator according to the first embodiment of the present invention.

FIG. 8 is a schematic diagram showing a configuration of a memory device including a coupling noise eliminator according to the first embodiment of the present invention.

The memory device of the first embodiment shown in FIG. 8 comprises a plurality of memory cells 100. In the memory device as the first embodiment, the memory cells of 32×32 are arranged in array and a read word line rdword0 and a write word line wrword0 are adjacent to each other, and NMOS transistors 21 and 22 as pull down transistors are formed every 16 bits on the write word line wrword0. Both the NMOS transistors 21 and 22 form a coupling noise eliminator.

Figure 9:
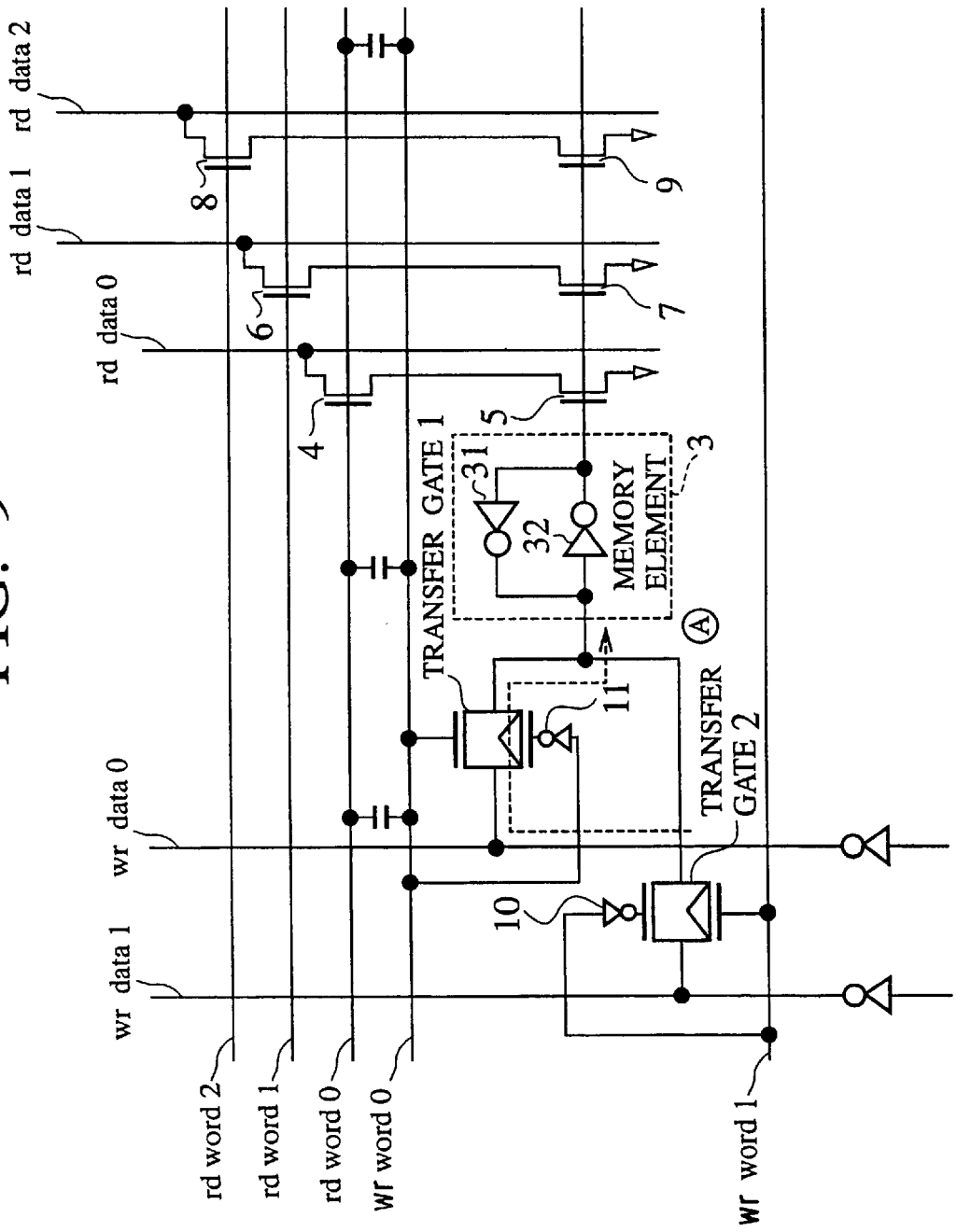
FIG. 9 is a circuit diagram showing a detailed configuration of a memory cell in the memory cell array in the memory device shown in FIG. 8.

FIG. 9 is a circuit diagram showing a detailed configuration of the memory cell in the memory cell array in the memory device according to the first embodiment shown in FIG. 8.

The transfer gates 1 and 2 for data writing, a memory element 3 as the memory cell made up of invertors 31 and 32, and NMOS transistors 4 to 9 for data reading from the memory element 3 are formed in the memory cell array.

Next, a description will be given of the operation of the memory device according to the first embodiment with referring to the timing chart shown in FIG. 10.

Figure 10:
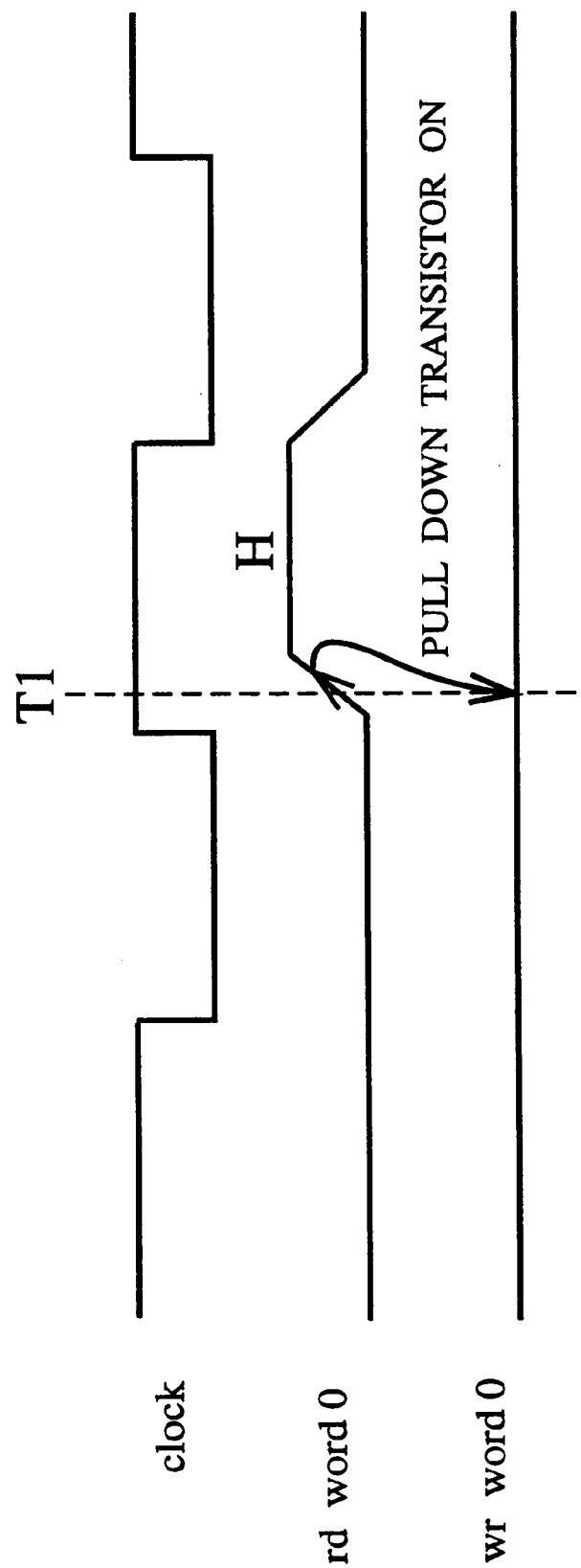
FIG. 10 is a diagram showing a waveform of voltage levels of a write word line and a read word line in the memory device shown in FIG. 8 where no coupling noise voltage is generated.

FIG. 10 is a diagram showing a waveform of voltage levels of the write word line wrword0 and the read word line rdword0 in the memory device shown in FIG. 8 where no coupling noise voltage is generated on the write word line wrword0.

When the level of the clock CLK is the H level, namely, when the level of the read word line reword0 becomes the H level at the timing T1 (in other words, when a control signal of the H level is supplied and transferred through the read word line rdword0), the NMOS transistor 4 enters ON and the data item stored in the memory element 3 is read out through the read data line rddata0.

In this case, both the pull down transistors 21 and 22 enter ON and the level of the write word line wrword0 is thereby fixed to the L level. Therefore, only a small coupling noise voltage is generated on the write word line wrword0 when the level of the read word line rdword0 is switched to the H level. No writing error occurs because this small coupling noise voltage on the write word line wrword0 can be neglected.

The generation mechanism of the coupling noise voltage will be explained in detail.

The addition of the pull down transistors 21 and 22 to the write word line wrword0 for the 16-th bit and 32-th bit in a word (32 bits per word) generates a coupling noise voltage of a small magnitude on the write word line wrword0. This coupling noise voltage generated on the write word line wrword0 can be expressed as follows:

$$\text{Coupling noise voltage} = ((2C_c + C_s)/4) \cdot (R/4) = 3CR/16,$$

where the intermediate node between 0-th bit and 15-th bit and the intermediate node between the bit 16-th bit and 32-th bit have the maximum coupling noise because the pull down transistors 21 and 22 are formed at the 16-th bit and the 32-th bit on the write word line wrword0, and Cc is a coupling capacity between the read word line reword0 and the write word line wrword0, Cs is a capacity between the write word line wrword0 and a substrate on which the memory device is formed, and Cc=Cs=C.

Thus, the coupling noise voltage generated on the write word linewrword0 becomes approximately 0.06V because the voltage caused on the write word line wrword0 is fallen to the L level during the time interval of 3CR/16. This coupling noise voltage of approximately 0.06V is smaller than the threshold voltage Vth(=0.4V) of the NHOS transistor as the transfer gate 1 adequately. Therefore no writing error occurs because the NMOS transistor as the transfer gate 1 can keep the OFF state.

As described above, according to the memory device of the first embodiment, the addition of the pull down transistors to the write word line wrword0 that is adjacent in configuration to the read word line wrword0 can prevent to cause the writing error during data reading. This feature can increase the reliability of the memory device. In addition, the hardware size of the register file is almost constant because this feature can be obtained only by adding the pull down transistors 21 and 22. Thus, the addition of the pull down transistors 21 and 22 is the most effective method to increase the reliability of the memory device.

Second Embodiment

Figure 11:
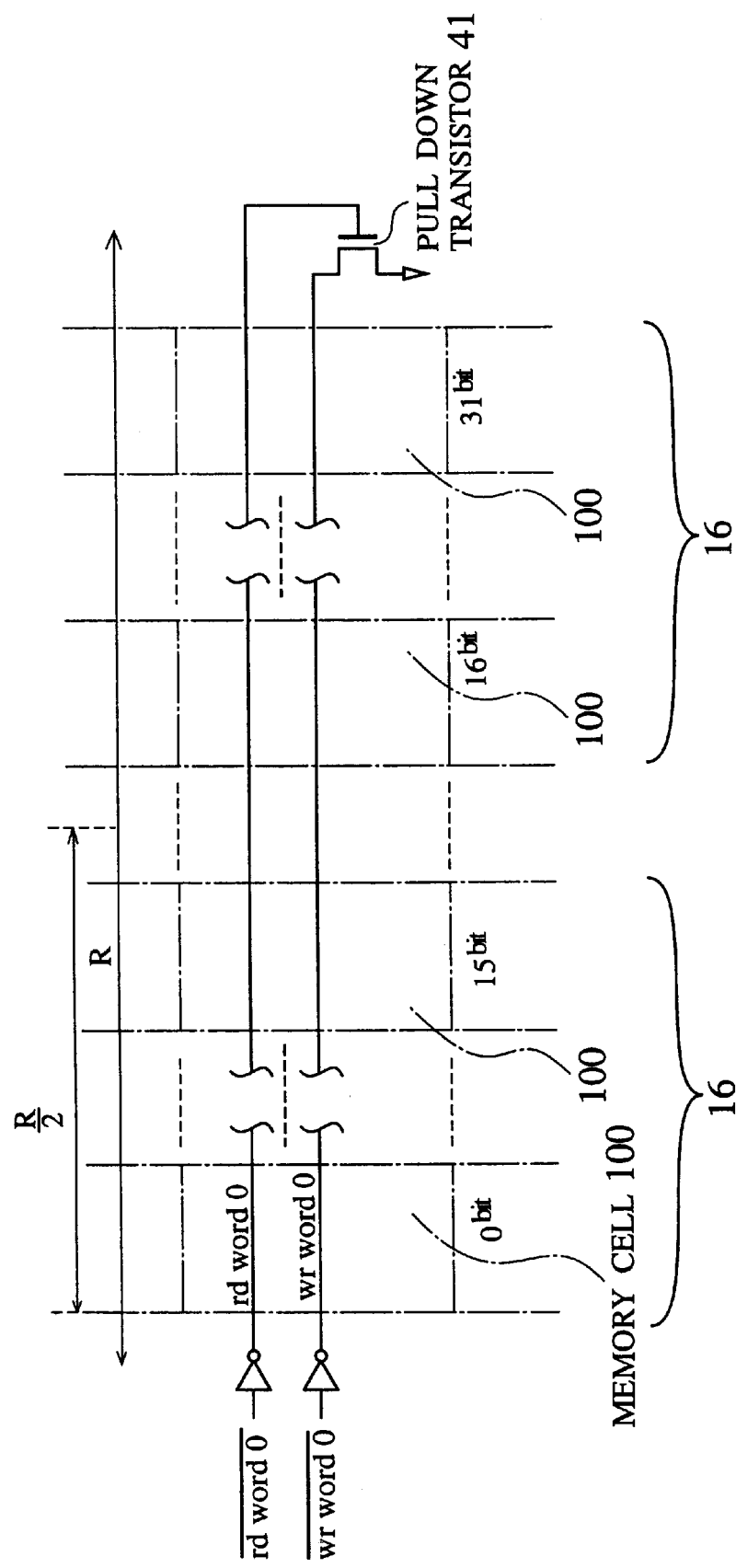
FIG. 11 is a schematic diagram showing a configuration of a memory device including a coupling noise eliminator according to the second embodiment of the present invention.

FIG. 11 is a schematic diagram showing the configuration of memory cells per word forming a memory cell array in a memory device including a coupling noise eliminator according to the second embodiment of the present invention. In FIG. 11, the circuit components in the memory device of the second embodiment that are the same as those of the memory device according to the first embodiment shown in FIG. 8 will be referred by the same reference numbers.

In the memory device of the second embodiment, a NMOS transistor as a pull down transistor 41 is formed on the write word line wrword0 at the 32-th bit every word (32 bits per word). The write word line wrword0 is adjacent in configuration to the read word line rdword0. This pull down transistor 41 forms a coupling noise eliminator.

Similar to the memory device according to the first embodiment, when the level of the read word line reword0 becomes the H level (in other words, when a control signal of the H level is supplied and transferred through the read word line rdword0), the NMOS transistor as the pull down transistor 41 enters ON in order to fix the write word line wrword0 to the L level.

In the memory device of the second embodiment in which the pull down transistor 41 is formed at the 32-th bit every word, the coupling noise voltage generated on the write word line wrword0 can be expressed as follows:

$$\text{Coupling noise voltage} = (2 \cdot C_c + C_s)/2 \cdot (R/2) = 3CR/4,$$

where Cc is a coupling capacity between the read word line reword0 and the write word line wrword0, Cs is a capacity between the write word line wrword0 and a substrate on which the memory device is formed, and Cc=Cs=C.

Therefore the coupling noise voltage on the write word line wrword0 becomes approximately 0.25V. Because this coupling noise voltage 0.25V is smaller than the threshold voltage of the NMOS transistor as the transfer gate for data writing, the NMOS transistor as the transfer gate for data writing cannot enter ON. This means that no writing error occurs. Accordingly, the memory device of the second embodiment has the same effect of the memory device according to the first embodiment.

Third Embodiment

Figure 12:
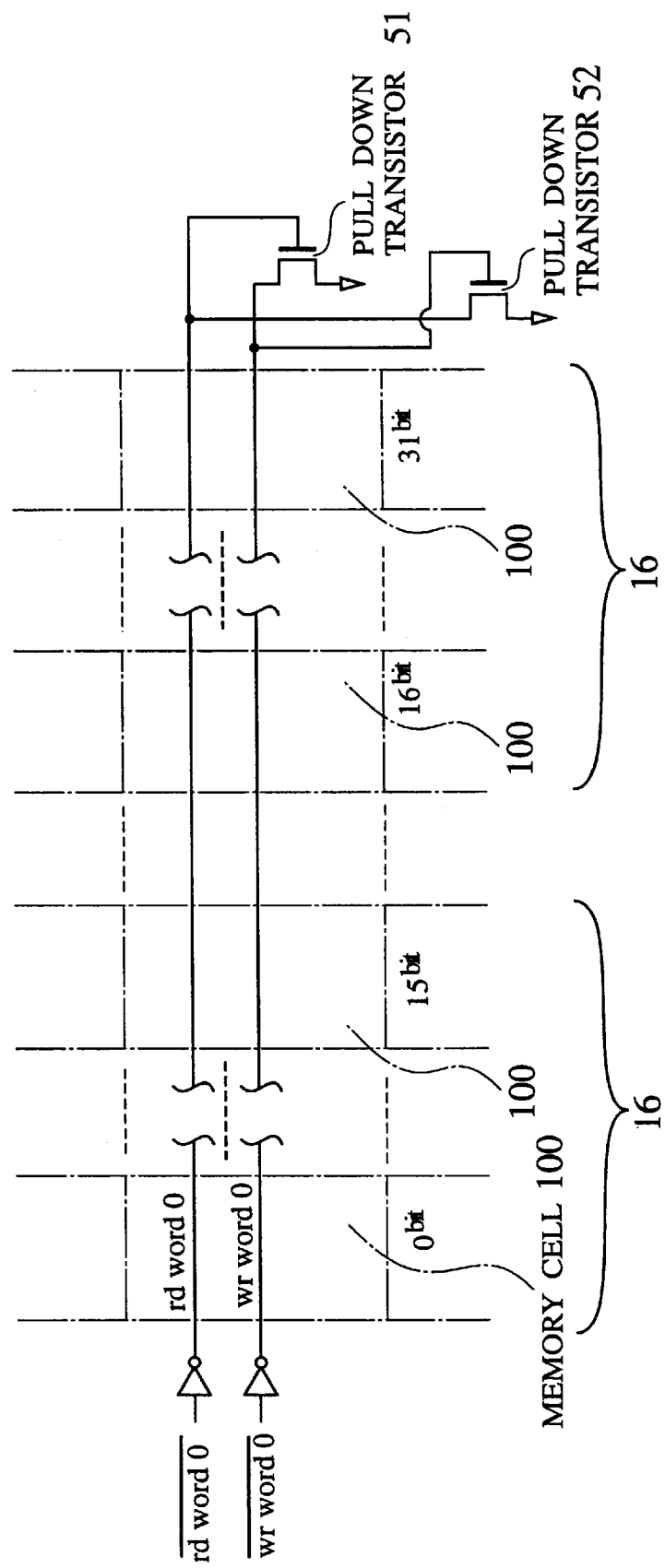
FIG. 12 is a schematic diagram showing a configuration of a memory device including a coupling noise eliminator according to the third embodiment of the present invention.

FIG. 12 is a schematic diagram showing a configuration of a memory device including a coupling noise eliminator according to the third embodiment of the present invention. In FIG. 12, the circuit components in the memory device of the second embodiment that are the same as those of the memory device according to the first embodiment shown in FIG. 8 will be referred by the same reference numbers.

In the memory device of the third embodiment, a NMOS transistor as a pull down transistor 51 is formed on the write word line wrword0 at the 32-th bit every word (32 bits per word) and a NMOS transistor as a pull down transistor 52 is formed on the read word line rdword0 at the 32-th bit every word. The write word line wrword0 is adjacent to the read word line rdword0. These pull down transistors 51 and 52 form a coupling noise eliminator.

Similar to the memory devices according to the first and second embodiments, when the level of the read word line reword0 becomes the H level (in other words, when a control signal of the H level is supplied and transferred through the read word line rdword0), the NMOS transistor as the pull down transistor 51 enters ON in order to fix the write word line wrword0 to the L level. Because the level of the coupling noise voltage generated in the write word line wrword0 is very small, no writing error happens.

In addition to this, when the level of the write word line wrword0 becomes the H level (in other words, when a control signal of the H level is supplied and transferred through the write word line wrword0), the NNOS transistor as the pull down transistor 52 enters ON in order to fix the read word line rdword0 to the L level. Because the level of the coupling noise voltage generated in the write word line wrword0 is also very small, no reading error happens.

Figure 13:
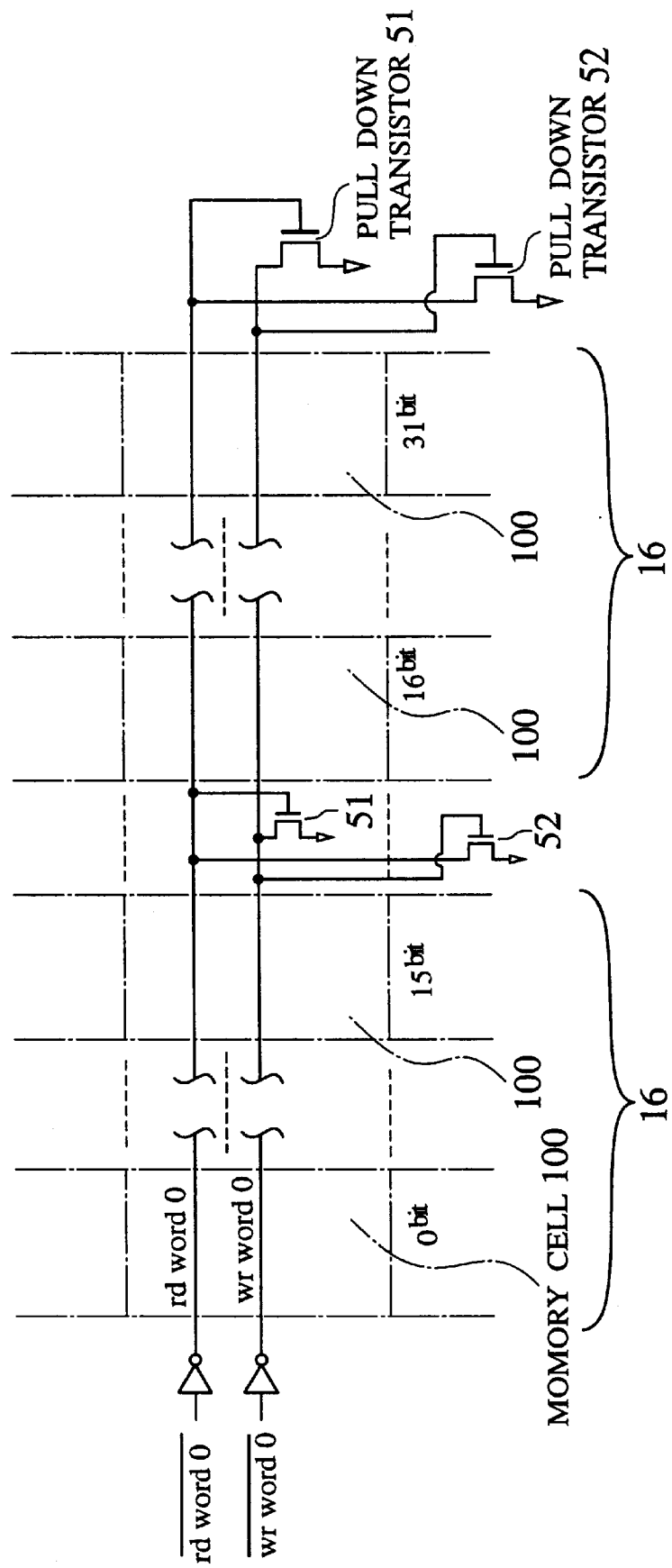
FIG. 13 is a schematic diagram showing another configuration of the memory device including another coupling noise eliminator according to the third embodiment of the present invention.

FIG. 13 is a schematic diagram showing another configuration of a memory device including another coupling noise eliminator according to the third embodiment of the present invention. In the memory device shown in FIG. 13, the pull down transistors 51 and 52 form the coupling noise eliminator. The NMOS transistor as the pull down transistor 51 is formed every 16-th bit on the write word line wrword0 that is formed adjacent to the read word line rdword0, and the NMOS transistor as the pull down transistor 52 is formed every 16-th bit on the read word line rdword0. Accordingly, the configuration of the memory device shown in FIG. 13 also prevents to cause no writing error and no reading error even if the write word line wrword0 is adjacent in arrangement to the read word line rdword0, and the memory device of the third embodiment has the same effect that increases the reliability of the semiconductor device, like the memory devices of the first and second embodiments.

The present invention is not limited by the configuration of the memory devices according to the first, second, and third embodiments described above, for example, it is possible in configuration to form the pull down transistors of not less than three in each of a word line and a read word line per word.

As described above, according to the present invention, it is possible to prevent the occurrence of writing error and reading error caused by the coupling noise voltage only by adding one or more pull down transistors as the coupling noise eliminator.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A memory device comprising:
   a memory cell array made up of a plurality of memory cells arranged in a matrix;
   a first signal line configured to transfer a first control signal to read data from a memory cell in the memory cell array;
   a second signal line adjacent in configuration to the first signal line, configured to transfer a second control signal to write data to a memory cell in the memory cell array, the first control signal and the second control signal being not generated simultaneously; and
   a first switching element of not less than one which enters ON/OFF state according to a level of the first control signal and configured to supply a desired voltage to the second signal line when the first switching element enters ON.

2. The device according to the claim 1, wherein the first switching element is formed on the first signal line every desired number-th bit in the memory cells forming the memory cell array.

3. The memory device according to the claim 2, wherein the first switching element is a NMOS FET as a pull down transistor that is capable of setting the level of the second signal line to a desired level.

4. The memory device according to the claim 1, further comprising a second switching element of not less than one which enters ON/OFF state according to a level of the second control signal and for supplying a desired voltage to the first signal line.

5. The memory device according to the claim 4, wherein the second switching element is formed on the second signal line every desired number-th bit in the memory cells forming the memory cell array.

6. The memory device according to the claim 4, wherein the second switching element is a NMOS FET as a pull down transistor that is capable of setting the level of the first signal line to the desired level.

7. A coupling noise elimination method comprising the step of:
   providing a desired voltage level to a second signal line, through which a second control signal to write data to a memory cell in a memory cell array is transferred, by a switching element that enters ON/OFF states according to a voltage level of a first control signal to read data from a memory cell in the memory cell array transferred through a first signal line adjacent in configuration to the second signal line, the first control signal and the second control signal being not provided simultaneously.

8. A coupling noise eliminator comprising:
   a switch element that enters ON/OFF states according to a level of a first control signal to read data from a memory cell in a memory cell array transferred through a first signal line, the switch element providing a desired voltage level to a second signal line adjacent in configuration to the first signal line, and a second control signal to write data to a memory cell in the memory cell array being transferred through the second signal line, the first control signal and the second control signal being not generated simultaneously.

\* \* \* \* \*